US010310391B2

(12) United States Patent
Lipson et al.

(10) Patent No.: US 10,310,391 B2
(45) Date of Patent: Jun. 4, 2019

(54) ELECTROSTATIC CLAMP AND A METHOD FOR MANUFACTURING THE SAME

(71) Applicant: ASML Holding N.V., Veldhoven (NL)

(72) Inventors: Matthew Lipson, Stamford, CT (US); Vincent Dimilia, Pleasantville, NY (US); Ronald Peter Totillo, Brookfield, CT (US); Tammo Uitterdijk, Wilton, CT (US); Steven Michael Zimmerman, Beacon, NY (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 15/504,749

(22) PCT Filed: Jul. 9, 2015

(86) PCT No.: PCT/EP2015/065730
§ 371 (c)(1),
(2) Date: Feb. 17, 2017

(87) PCT Pub. No.: WO2016/030069
PCT Pub. Date: Mar. 3, 2016

(65) Prior Publication Data
US 2017/0242345 A1    Aug. 24, 2017

Related U.S. Application Data

(60) Provisional application No. 62/042,133, filed on Aug. 26, 2014.

(51) Int. Cl.
*G03B 27/58* (2006.01)
*G03F 7/20* (2006.01)
(Continued)

(52) U.S. Cl.
CPC ........ *G03F 7/70708* (2013.01); *G03F 7/7095* (2013.01); *G03F 7/70783* (2013.01);
(Continued)

(58) Field of Classification Search
CPC ............... G03F 7/70708; G03F 7/7095; G03F 7/70783; G03F 7/70875; C03B 23/20;
(Continued)

(56) References Cited

U.S. PATENT DOCUMENTS 6,219,237 B1 * 4/2001 Geusic .................. H01L 23/473
165/80.4
6,864,957 B2   3/2005 Van Elp et al.
(Continued)

FOREIGN PATENT DOCUMENTS

EP    1 359 466 A1   11/2003
JP    2004-047982 A   2/2004
(Continued)

OTHER PUBLICATIONS

International Search Report and Written Opinion of the International Searching Authority directed to related International Patent Application No. PCT/EP2015/065730, dated Oct. 20, 2015; 10 pages.
(Continued)

*Primary Examiner* — Peter B Kim
(74) *Attorney, Agent, or Firm* — Sterne, Kessler, Goldstein & Fox P.L.L.C.

(57) ABSTRACT

An electrostatic clamp (300) and a method for manufacturing the same is disclosed. The electrostatic clamp includes a first layer (302) having a first ultra-low expansion (ULE) material, a second layer (304) coupled to the first layer, having a second ULE material, and a third layer (306), coupled to the second layer, having a third ULE material. The electrostatic clamp further includes a plurality of fluid channels (316) located between the first layer and the second layer and a composite layer (308) interposed between the second layer and the third layer. The method for manufacturing the electrostatic clamp includes forming the plurality
(Continued)

of fluid channels, disposing the composite layer on the third layer, and coupling the third layer to the second layer. The plurality of fluid channels is configured to carry a thermally conditioned fluid for temperature regulation of a clamped object.

7 Claims, 9 Drawing Sheets

(51) Int. Cl.
*H01L 21/67* (2006.01)
*H01L 21/683* (2006.01)
*C03B 23/20* (2006.01)
*C03B 25/02* (2006.01)

(52) U.S. Cl.
CPC .... *G03F 7/70875* (2013.01); *H01L 21/67103* (2013.01); *H01L 21/67109* (2013.01); *H01L 21/6831* (2013.01); *H01L 21/6833* (2013.01); *C03B 23/20* (2013.01); *C03B 25/02* (2013.01)

(58) Field of Classification Search
CPC ............... C03B 25/02; H01L 21/67103; H01L 21/6833; H01L 21/67109
See application file for complete search history.

(56) References Cited

U.S. PATENT DOCUMENTS

| | | | |
|---|---|---|---|
| 8,098,475 B2 | 1/2012 | Sijben | |
| 8,105,457 B2 | 1/2012 | Van Elp | |
| 8,879,233 B2 | 11/2014 | Cooke et al. | |
| 2001/0050759 A1* | 12/2001 | Kamiya | G03F 7/2002 |
| | | | 355/30 |
| 2002/0081498 A1* | 6/2002 | Ehrmann | B82Y 10/00 |
| | | | 430/5 |
| 2004/0079518 A1* | 4/2004 | del Puerto | G03F 7/70716 |
| | | | 165/58 |
| 2006/0119822 A1* | 6/2006 | Fehr | G02B 17/0657 |
| | | | 355/55 |

FOREIGN PATENT DOCUMENTS

| | | | | |
|---|---|---|---|---|
| JP | 2005-276886 A | 10/2005 | | |
| JP | 2006-287210 A | 10/2006 | | |
| JP | 2007-523030 A | 8/2007 | | |
| JP | 2008-071845 A | 3/2008 | | |
| JP | 2010-052015 A | 3/2010 | | |
| JP | 2010-541196 A | 12/2010 | | |
| JP | 2012-527125 A | 11/2012 | | |
| WO | WO 2013113568 A2 * | 8/2013 | ......... | G03F 7/70416 |

OTHER PUBLICATIONS

"Research Disclosure," Database No. 591051, Mason Publications, vol. 591, No. 51, Jul. 1, 2015; 9 pages.

* cited by examiner

ELECTROSTATIC CLAMP AND A METHOD FOR MANUFACTURING THE SAME

CROSS REFERENCE

This application claims the benefit of U.S. application Ser. No. 62/042,133, which was filed on Aug. 26, 2014, and which is incorporated herein in its entirety by reference.

FIELD

The present disclosure relates to an electrostatic clamp for supporting an object, for example, a patterning device and/or a substrate in a lithographic apparatus, and a method for manufacturing the same.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 \lambda / NA \quad (1)$$

where λ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength λ, by increasing the numerical aperture NA, or by decreasing the value of $k_1$.

In order to shorten the exposure wavelength, and thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

The radiation generated by such sources will not, however, be only EUV radiation and the source may also emit at other wavelengths including infra-red (IR) radiation and deep ultra-violet (DUV) radiation. DUV radiation can be detrimental to the lithography system as it can result in a loss of contrast. Furthermore unwanted IR radiation can cause heat damage to components within the system. It is therefore known to use a spectral purity filter to increase the proportion of EUV in the transmitted radiation and to reduce or even eliminate unwanted non-EUV radiation such as DUV and IR radiation.

A lithographic apparatus using EUV radiation may require that the EUV radiation beam path, or at least substantial parts of it, must be kept in vacuum during a lithographic operation. In such vacuum regions of the lithographic apparatus, an electrostatic clamp may be used to clamp an object, such as a patterning device and/or a substrate to a structure of the lithographic apparatus, such as a patterning device table and/or a substrate table, respectively.

In addition, a lithographic apparatus using EUV radiation may require temperature regulation of, for example, the patterning device and/or the substrate. Heat produced by the EUV radiation or the unwanted non-EUV radiation may cause deformations in, for example, the patterning device and/or the substrate during a lithographic operation because of the heat absorbed by the patterning device and/or the substrate. To reduce the deformation, a coolant may be circulated through the electrostatic clamp. However, configuring an electrostatic clamp for circulating a coolant can create stress in the clamp structure. This stress may be transferred to the object (e.g., patterning device, substrate) clamped to the electrostatic clamp, resulting in deformations in the clamped object.

SUMMARY

Accordingly, there is a need for an electrostatic clamp that can be configured to securely hold an object and prevent heat-induced and stress-induced deformation in the clamped object.

According to an embodiment, an electrostatic clamp includes a first layer, a second layer, and a third layer. Each of the first, second, and third layer includes a first, second, and third ultra-low expansion (ULE) material, respectively. The first layer may be coupled to the second layer and the second layer may be coupled to the third layer. The electrostatic clamp further includes a plurality of fluid channels located between the first layer and the second layer and a composite layer interposed between the second layer and the third layer. The plurality of fluid channels may be configured to carry a thermally conditioned fluid.

In another embodiment, a device manufacturing method is provided. The method includes forming a plurality of fluid channels between a first layer and a second layer. The plurality of fluid channels may be configured to carry a thermally conditioned fluid. The method further includes disposing a composite layer on a third layer and coupling the third layer to the second layer. The composite layer may include alternating electrically conductive layers and electrically insulating layers.

Yet in another embodiment, a lithographic apparatus includes a chuck and an electrostatic clamp coupled to the chuck. The electrostatic clamp may be configured to releasably hold a patterning device. The electrostatic clamp includes a first layer having opposing first and second surfaces, a second layer having opposing third and fourth surfaces, and a third layer having opposing fifth and sixth surfaces. The fourth surface may be coupled to the first surface and the sixth surface may be coupled to the third surface. The electrostatic clamp further includes an array of channels located between the first surface and the fourth surface.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective Lithographic System

Figure 1:
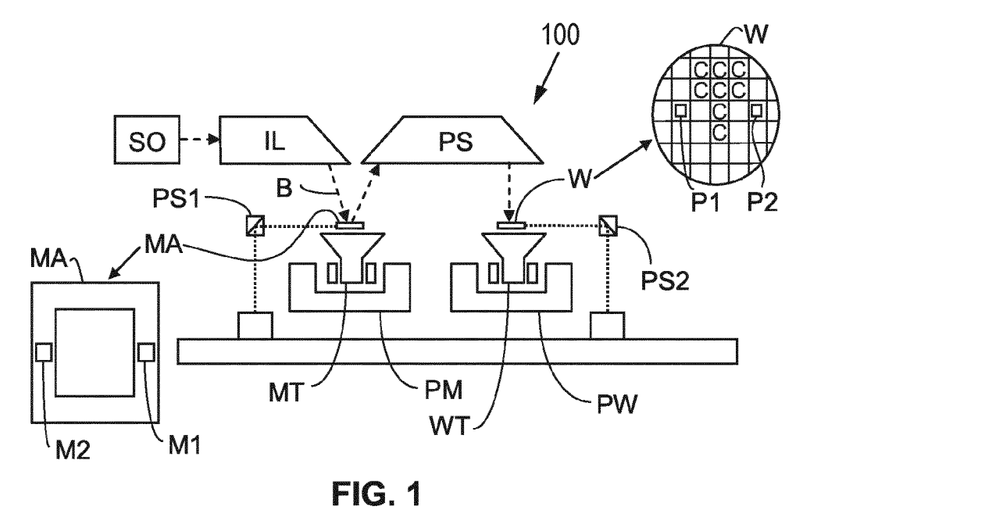
FIG. 1 is a schematic illustration of a reflective lithographic apparatus, according to an embodiment of the invention.

FIG. 1 schematically shows a lithographic apparatus 100 including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be reflective (as in lithographic apparatus 100 of FIG. 1) or transmissive. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
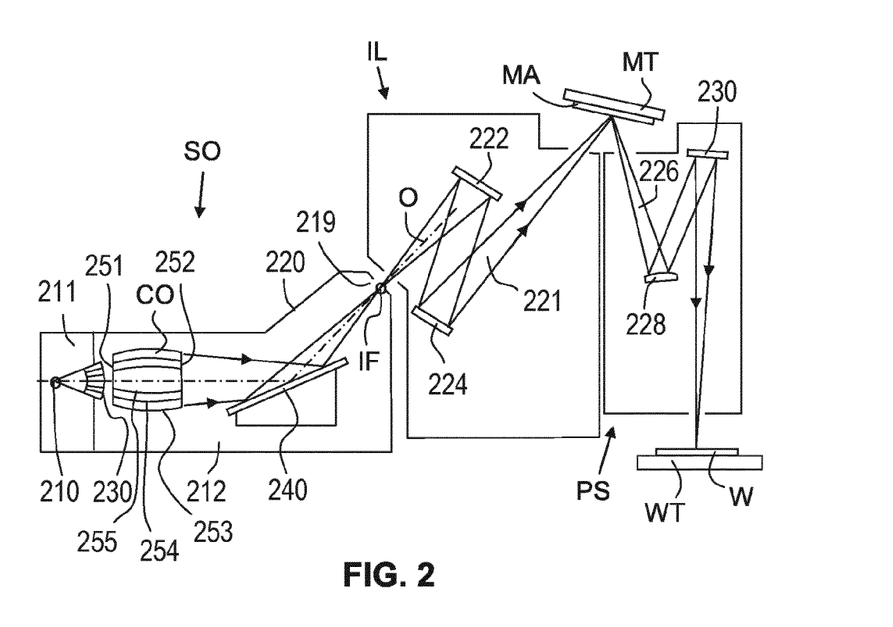
FIG. 2 is a more detailed schematic illustration of the reflective lithographic apparatus, according to an embodiment of the invention.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Embodiments of Electrostatic Clamp

Figure 3:
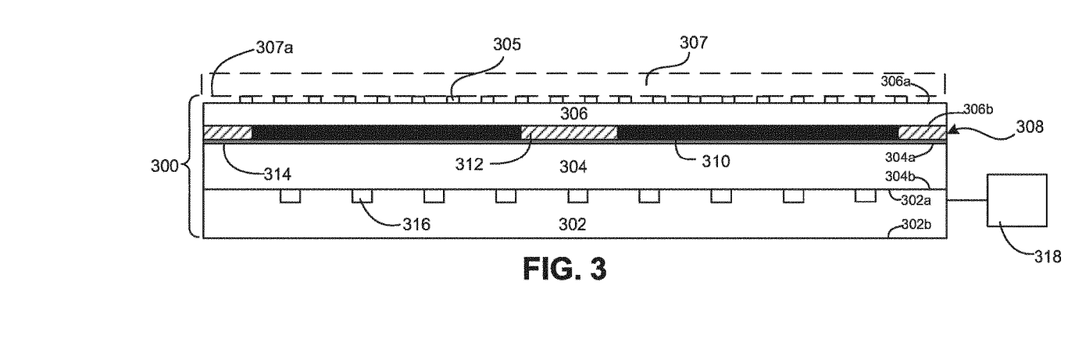
FIG. 3 is a schematic illustration of a cross-sectional view of an electrostatic clamp, according to an embodiment of the invention.

FIG. 3 illustrates a schematic of a cross-sectional view of an electrostatic clamp 300 that can be implemented as a part of lithographic apparatus 100, according to an embodiment. In an example of this embodiment, electrostatic clamp 300 may be used for holding substrate W on substrate table WT or patterning device MA on support structure MT in lithographic apparatus 100.

According to an embodiment, electrostatic clamp 300 may comprise a multi-layered structure including a first layer 302 having opposing and parallel surfaces 302a and 302b, a second layer 304 having opposing and parallel surfaces 304a and 304b, and a third layer 306 having opposing and parallel surfaces 306a and 306b. First layer 302, second layer 304, and third layer 306 may have vertical dimensions in the range of about 1-4 mm, 1-4 mm, and 50-200 microns, respectively, according to an example of this embodiment. First layer 302 may be coupled to second layer 304 with surface 302a being in substantial contact with surface 304b and third layer 306 may be coupled to second layer 304 with surface 304a facing surface 306b. Surface 306a of third layer 306 may define a clamping surface 306a of electrostatic clamp 300. Clamping surface 306a may be configured to receive an object 307 (e.g., substrate W or patterning device MA) to be clamped to electrostatic clamp 300. Object 307 may be clamped to be in substantial contact with clamping surface 306a. Optionally, clamping surface 306a may include burls 305 configured to be in contact with object 307 during clamping operation. Burls 305 may help to provide less contaminated contact between object 307 and clamping surface 306a as contaminants are less likely to be on the smaller surface area of burls 305 than the larger surface area of clamping surface 306a.

In an embodiment, first layer 302, second layer 304, and third layer 306 may comprise materials different from each other. In another embodiment, first layer 302, second layer 304, and third layer 306 may be manufactured out of one or more dielectric materials configured to support an electrostatic field during operation of electrostatic clamp 300, as further explained in below. The dielectric materials may have ultra-low thermal expansion coefficients that may be equal to zero or substantially zero, such as, but not limited to, an ultra-low expansion silicon-based material (e.g., ULE® manufactured by Corning), a glass material, a ceramic material, a silicon-based glass ceramic material (e.g., ZERODUR® manufactured by SCHOTT), or a combination thereof. Any of these ultra-low expansion thermal materials may help to reduce thermal stress in the structure of electrostatic clamp 300 during its manufacture. Thermal stress in electrostatic clamp 300 if not reduced may result in one or more unwanted deformations in first layer 302, second layer 304, and/or third layer 306, which may be transferred to object 307 during clamping operation.

In another embodiment, first layer 302 and/or second layer 304 may be manufactured out of one or more non-dielectric insulating materials having ultra-low thermal expansion coefficients.

Yet in another embodiment, first layer 302, second layer 304, and third layer 306 may be manufactured out of the same one or more ultra-low thermal expansion dielectric materials. Manufacturing all three layers of electrostatic clamp 300 from similar materials may help to further reduce thermal stress due to thermal expansion mismatch between dissimilar materials. In an example of this embodiment, first layer 302, second layer 304, and third layer 306 may be manufactured out of the ULE® material, which provides higher electrical stability than the ZERODUR® material.

As illustrated in FIG. 3, electrostatic clamp 300 further comprises a composite layer 308 interposed between second layer 304 and third layer 306, according to an embodiment. In an example of this embodiment, composite layer 308 may have a vertical dimension in the range of about 50-200 nm. Composite layer 308 includes electrically conductive layers 310 and insulating layers 312 that are arranged in an alternating configuration. One of electrically conductive layers 310 is electrically isolated from the other by one of insulating layers 312. Although FIG. 3 illustrates only two electrically conductive layers, it is to be understood that in other modifications of the invention composite layer 308 may include a single or more than two electrically conductive layers. In an embodiment, electrically conductive layers 310 and insulating layers 312 are coplanar.

In various examples of this embodiment, any suitable electrically conductive material such as, but not limited to, aluminium, chrome, platinum, gold, or a combination thereof, may be used to form electrically conductive layers 310 and any suitable insulating material such as, silicon oxide may be used to form insulating layers 312. In another example, electrically conductive layers 310 may comprise a single layer of metal, multiple layers of a same metal, or multiple layers of different metals.

Electrically conductive layers 310 may be configured as electrodes 310 to generate an electrostatic field within third layer 306 for clamping object 307 to clamping surface 306a, according to an example embodiment. The electrostatic field may be generated by providing a clamping voltage to electrodes 310. The clamping voltage may induce surface image charges on a conductive surface 307a of object 307 to electrostatically attract and clamp object 307 to clamping surface 306a.

Electrostatic clamp 300 may optionally comprise an intermediate layer 314 interposed between composite layer 308 and second layer 304, as illustrated in FIG. 3, according to an embodiment. Intermediate layer 314 may comprise a silicon-based material, such as silicon oxide, and may be configured as a bonding medium for bonding composite layer 314 to second layer 304. In an example of this embodiment, intermediate layer 314 may have a vertical dimension of about 10-200 nm. Alternatively, intermediate layer 314 may be interposed between composite layer 308 and third layer 306, as discussed in further details below with reference to FIGS. 5J-K.

In a further embodiment, electrostatic clamp 300 comprises fluid channels 316, as illustrated in FIG. 3. Fluid channels 316 may be configured to run parallel to surface 302a and carry a thermally conditioned fluid (e.g., liquids or gas), such as, but not limited to water, air, alcohols, glycols, or phase change coolants (e.g., Freons, carbon dioxide). A fluid conditioning system 318 coupled to electrostatic clamp 300 may be configured to condition the thermally conditioned fluid to a desired temperature before entering fluid channels 316 and to circulate it through electrostatic clamp 300. The circulating thermally conditioned fluid may help to regulate temperature of electrostatic clamp 300 to a desired temperature. Temperature regulation of electrostatic clamp 300 may include absorbing unwanted heat by the thermally conditioned fluid from electrostatic clamp 300. This unwanted heat may be transferred through clamping surface 306a and/or burls to electrostatic clamp 300 from object 307 in a clamped state.

In an example of this embodiment, object 307 may be a patterning device and the unwanted heat may be transferred to the patterning device from, for example, projection system PS, and/or other systems of lithographic apparatus 100 during their operation. Presence of unwanted heat in the patterning device may cause deformation of the patterning device that may lead to errors in the patterns transferred from the patterning device to the substrate. To prevent this deformation, the temperature of the patterning device may be maintained at substantially room temperature (approximately 22 degrees Celsius) or any other defined operating temperature, according to various embodiments. This temperature regulation of the patterning device may include transferring of heat from the patterning device (e.g., through clamping surface 306a, burls 316) to electrostatic clamp 300, as discussed above, and thereby reducing or eliminating the heat-induced deformation of the patterning device.

Figure 4:
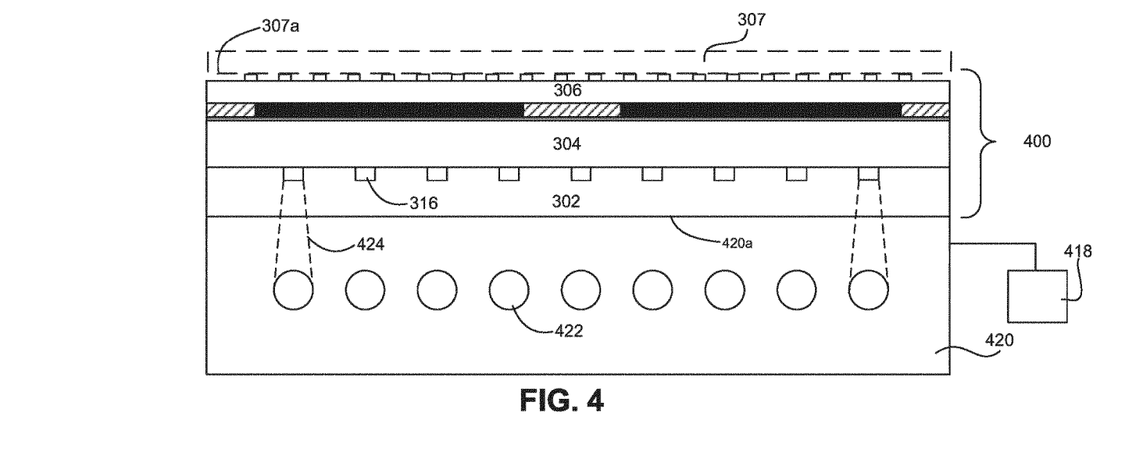
FIG. 4 is a schematic illustration of a cross-sectional view of an electrostatic clamp and a chuck, according to an embodiment of the invention.

FIG. 4 illustrates a schematic of a cross-sectional view of an electrostatic clamp 400 coupled to a chuck 420, according to an embodiment. Electrostatic clamp 400 and chuck 420 can be implemented as a part of lithographic apparatus 100, according to an example of this embodiment. Chuck 420 may be configured to couple electrostatic clamp 400 to substrate table WT and/or support structure MA in an example embodiment. Electrostatic clamp 400 may be similar to electrostatic clamp 300 in structure and function except for the differences described below. In an example embodiment, fluid channels 316 of electrostatic clamp 400 may be coupled to fluid channels 422 of chuck 420 through vias 424, as illustrated in FIG. 4. Fluid channels 422 may be configured to run parallel to surface 420a and to carry a thermally conditioned fluid as fluid channels 316. A fluid conditioning system 418 coupled to chuck 420 may be configured to condition the thermally conditioned fluid to a desired temperature before entering fluid channels 422 and to circulate it through electrostatic clamp 400 and chuck 404. The circulating thermally conditioned fluid may help to regulate temperature of electrostatic clamp 400 and chuck 420 to a desired temperature. Temperature regulation of electrostatic clamp 400 and chuck 420 may include absorbing unwanted heat by the thermally conditioned fluid from electrostatic clamp 400 and chuck 420. The unwanted heat in electrostatic clamp 400 may be transferred from object 307, as described above and the unwanted heat in chuck 420 may be transferred from electrostatic clamp 400 and/or other parts of lithographic apparatus 100 coupled to chuck 420.

An Example Method for Manufacturing an Electrostatic Clamp

Figure 5A:
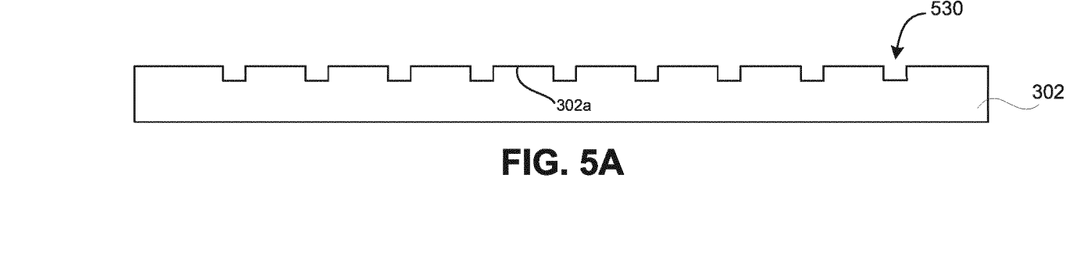
FIGS. 5A-N are schematic illustrations of cross-sectional views of an electrostatic clamp at select stages of its manufacturing process, according to an embodiment of the invention.
Figure 5B:
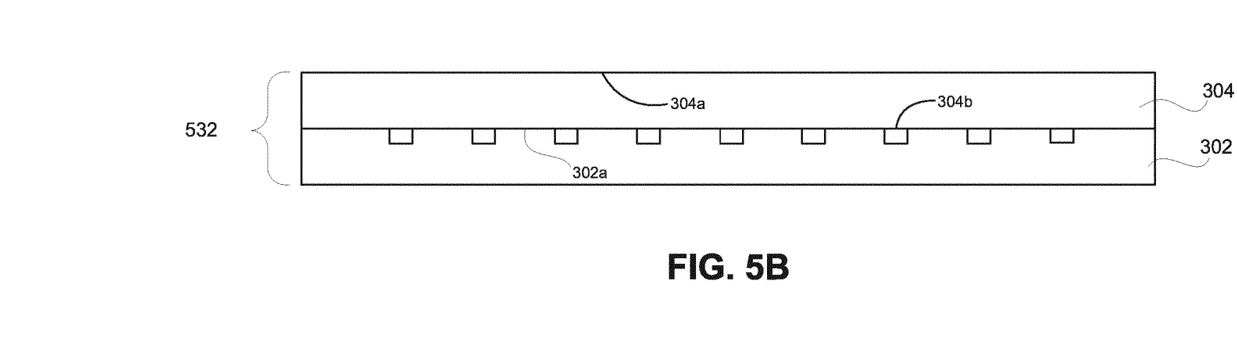
Figure 5C:
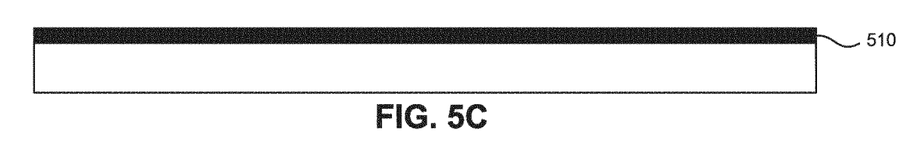
Figure 5D:
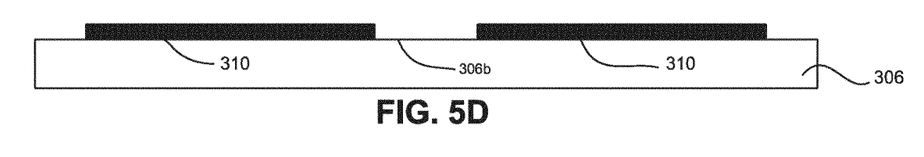
Figure 5E:
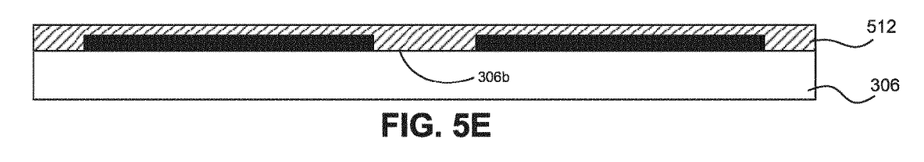
Figure 5F:
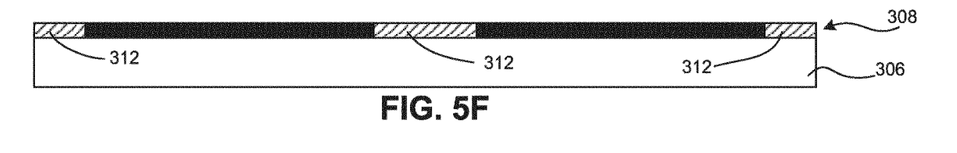
Figure 5G:
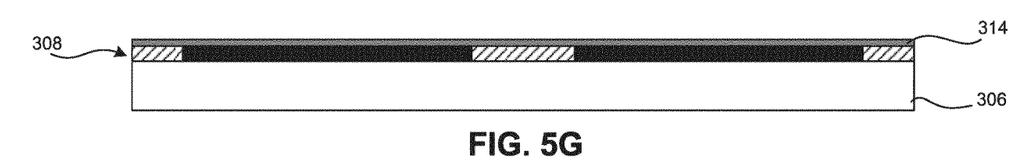
Figure 5H:
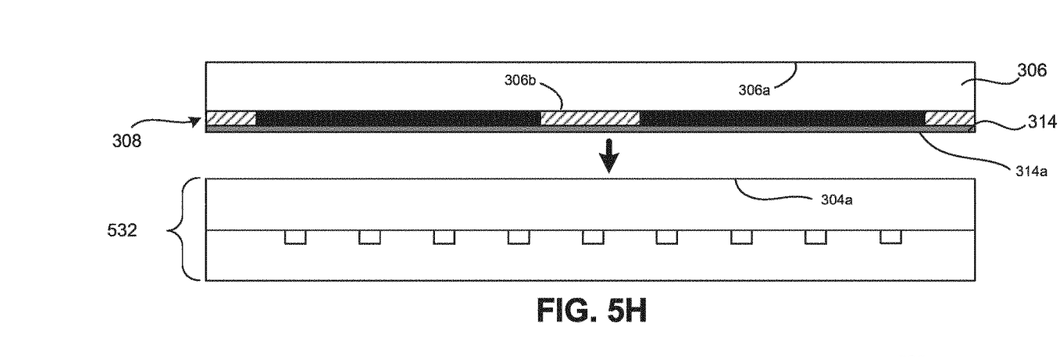
Figure 5I:
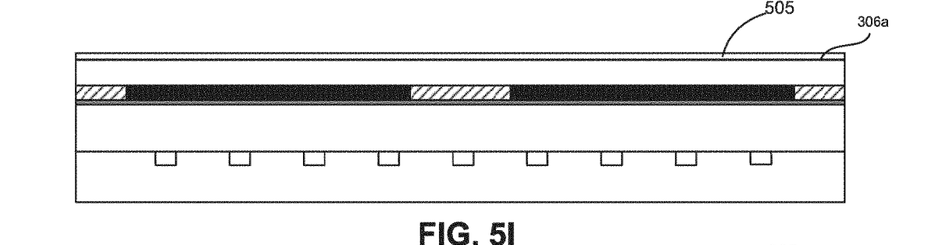
Figure 5J:
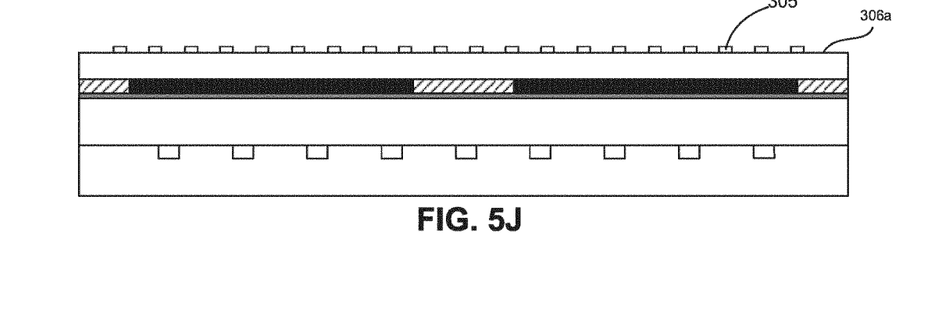
Figure 5K:
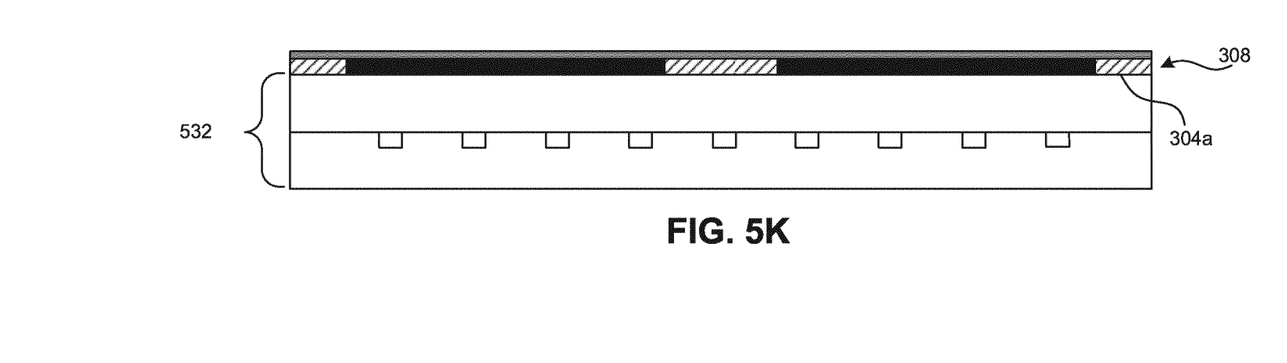
Figure 5L:
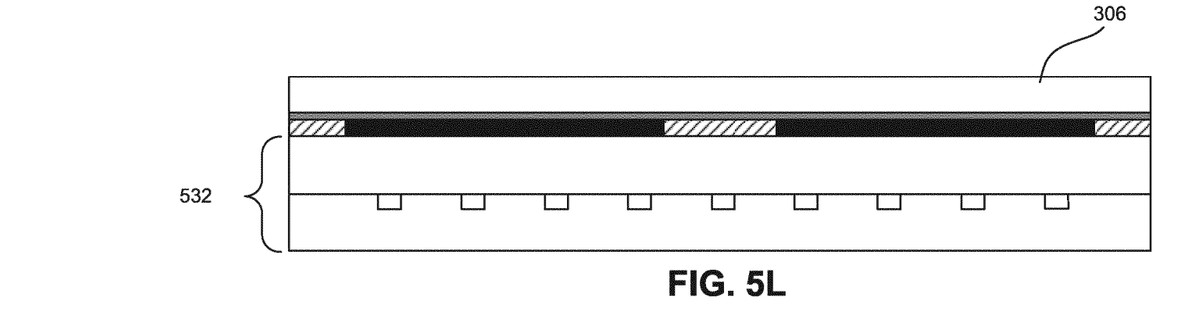
Figure 5M:
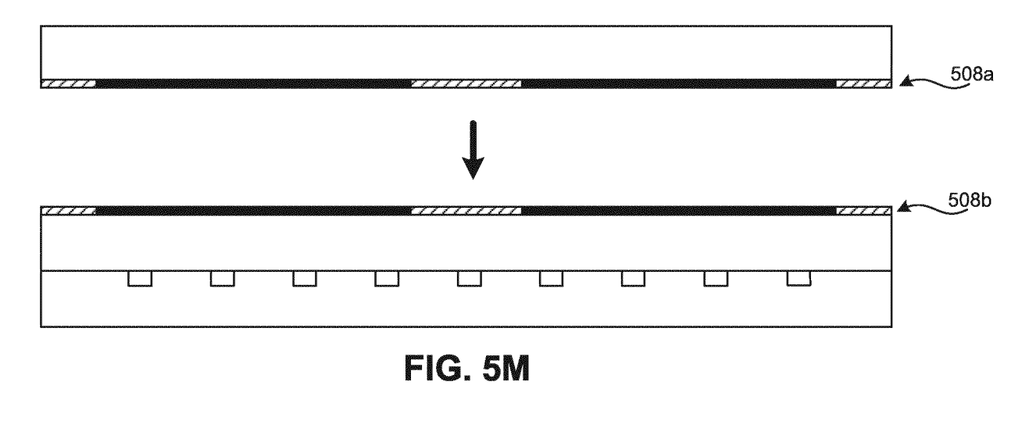
Figure 5N:
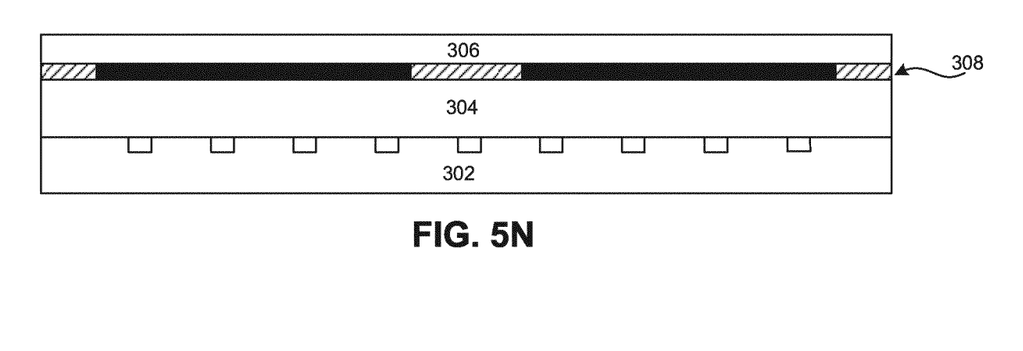

FIGS. 5A-N illustrate cross-sectional views of electrostatic clamp 300 (as shown in FIG. 3) at select stages of its manufacturing process, according to an embodiment.

FIGS. 5A-B illustrate cross-sectional views of a partially formed electrostatic clamp 300 during formation of fluid channels 316 (as described above with reference to FIGS. 3-4), according to an embodiment. The formation of fluid channels 316 may include formation of trenches 530 on surface 302a of first layer 302 (as shown in FIG. 5A) and formation of a stacked structure 532 (as shown in FIG. 5B).

The formation of trenches 530 may include polishing, machining, and etching of surface 302a, according to an embodiment. The polishing of surface 302a may be performed using any suitable polishing process, such as, but not limited to, cerium oxide slurry polishing process to obtain a smooth surface having a root mean square (RMS) roughness of about 0.5 mm or lower. Following the polishing, surface 302a may be machined using standard glass machining techniques and/or patterned and etched using standard photolithography and glass etching process to form trenches 530 (as shown in FIG. 5A). It should be noted that the rectangular cross-sectional shape of trenches 530, as illustrated in FIG. 5A, is for illustrative purposes, and is not limiting. Trenches 530 can have other cross-sectional shapes (e.g., conical, trapezoidal), according to various embodiments, without departing from the spirit and scope of the present invention. Subsequent to the machining, an acid etch may be performed on the machined surface 302a using, for example, an acid mixture comprising hydrofluoric acid. The acid etch may remove few microns (e.g., about 5 microns) of layer 302 material from machined surface 302a. This removal of material from machined surface 302a may help to relieve stress in layer 302 that may be induced from the machining process. The stress may be due to small deformations on surface 302a that developed from the physical force of machining.

According to an embodiment, the acid etch process may be followed by the coupling of layer 302 to second layer 304 to form stacked structure 532, as illustrated in FIG. 5B. The coupling process may include polishing of surface 304b, cleaning of surfaces 302a and 304b followed by direct bonding of first layer 302 to second layer 304. Surface 304b may be polished to a root mean square (RMS) roughness of about 0.5 mm or lower using any suitable polishing process, such as, but not limited to, cerium oxide slurry polishing process. Subsequently, first layer 302 may be direct bonded to second layer 304 to form a stacked structure 532 by pressing surface 302a against surface 304b under a pressure suitable for the layer materials used. Optionally, the stacked structure 532 may be annealed at a temperature in the range of about 350-800 degrees Celsius to strengthen the direct bonded interface between first layer 302 and second layer 304.

Direct bonding herein may refer to an optical contact bonding that is a bonding between substantially defect free and highly polished surfaces (e.g., surfaces 302a and 304b) without the use of any bonding material, such as epoxy or any other adhesive material, according to an embodiment. Optical contact bonding may result from attractive intermolecular electrostatic interactions, such as Van der Waals forces between bonding surfaces (e.g., surfaces 302a and 304b). Annealing the optical contact bond (as described above) may transform, for example, the Van der Waals bonds between the bonding surfaces into stronger covalent bonds, and thereby strengthen the optical contact bonded structure.

The formation of fluid channels 316 may be followed by thinning down of layer 304 to about 2 mm, according to an embodiment. Surface 304b may be polished using any suitable polishing and/or grinding technique to thin down second layer 304. Alternatively, the thinning down process of second layer 304 may be performed prior to formation of fluid channel 316 by polishing surface 304a and/or surface 304b.

FIGS. 5C-D illustrate cross-sectional views of a partially formed electrostatic clamp 300 during formation of electrically conductive layers 310, according to an embodiment. The formation of electrically conductive layers 310 may include deposition of, for example, one or more metal layers 510 on third layer 306, as shown in FIG. 5C. This metal deposition may be followed by a patterning and an etching process to define electrically conductive layers 310, as shown in FIG. 5D. The deposition of layer 510 may be performed using any conventional methods suitable for metals such as, but not limited to, sputtering, thermal evaporation, atomic layer deposition (ALD), or chemical vapor deposition (CVD). The patterning process may be performed by conventional photolithography process and the etching process may be performed by wet etch methods or dry etch methods such as, but not limited to, reactive ion etching (RIE).

FIGS. 5E-F illustrate cross-sectional views of a partially formed electrostatic clamp 300 during formation of insulating layers 312, according to an embodiment. The formation of insulating layers 312 may include deposition of, for example, one or more dielectric layers 512 on electrically conductive layers 310 and exposed areas of surface 306b of third layer 306, as shown in FIG. 5E. This dielectric deposition may be followed by a patterning and an etching process to define insulating layers 312 as shown in FIG. 5F. The deposition of layer 512 may be performed using any conventional methods suitable for dielectric materials such as, but not limited to, CVD process, magnetron sputtering, thermal evaporation, or e-beam evaporation. The patterning and etching process may be performed by methods as mentioned above.

FIGS. 5G-H illustrate cross-sectional views of a partially formed electrostatic clamp 300 during bonding of composite layer 308 to stacked structure 532 (as described with reference to FIG. 5B), according to an embodiment. This bonding process may include depositing intermediate layer 314 on composite layer 308, as shown in FIG. 5G. The intermediate layer 314 may help to provide a bonding surface 314a to composite layer 308 compatible for direct bonding with surface 304a. The intermediate layer 314 may be deposited using any suitable methods for depositing, for example, silicon oxide, such as CVD process. The bonding process may further include pressing the combined structure of FIG. 5G against stacked structure 532 to bond surface 314a to surface 304a as shown in FIG. H. To strengthen the bonded interface between surface 314a and surface 304a, the bonded structure may be annealed at a temperature in the range of about 350-800 degrees Celsius.

Optionally, the bonding process may be followed by a thinning down process of third layer 306 to a vertical dimension in the range of about 50-200 microns, according to an embodiment. Surface 306a may be polished using any suitable polishing and/or grinding technique to thin down layer 306. Alternatively, the thinning down process of third layer 306 may be performed prior to formation of composite layer 308 by polishing surface 306a and/or surface 306b.

FIG. 5I-J illustrate cross-sectional views of an electrostatic clamp 300 during formation of burls 305 on clamping surface 306a, according to an embodiment. Burls 305 may be formed by depositing, for example, a polymeric layer 505 as shown in FIG. 5I. This deposition may be followed by patterning and etching polymeric layer 505 to define burls 305, as shown in FIG. 5J. The patterning and etching process may be performed by methods as mentioned above. It should be noted that the rectangular cross-sectional shape of burls 305 is for illustrative purposes, and is not limiting. Burls 305 can have other cross-sectional shapes (e.g., spherical, conical, trapezoidal), according to various embodiments, without departing from the spirit and scope of the present invention.

In an alternative approach, composite layer 308 and intermediate layer 314 may be formed on surface 304a of stacked structure 532 as illustrated in FIG. 5K, according to an embodiment. Third layer 306 may be direct bonded to intermediate layer 314 and thinned down to a vertical dimension in the range of about 50-200 microns, as shown in FIG. 5L. The direct bonding and the thinning down may be performed by methods as mentioned above.

As illustrated in FIG. 5M, in another alternative approach, a first portion 508a and a second portion 508b of composite layer 308 may be formed on surface 306b and surface 304a, respectively, according to an embodiment. First portion 508a and second portion 508b may be thermally fused together to form composite layer 308, as shown in FIG. 5N. This approach of forming composite layer 308 in an electrostatic clamp may help to eliminate the use of a bonding medium (e.g., intermediate layer 314).

An Example Method for Coupling an Electrostatic Clamp to a Chuck

Figure 6:
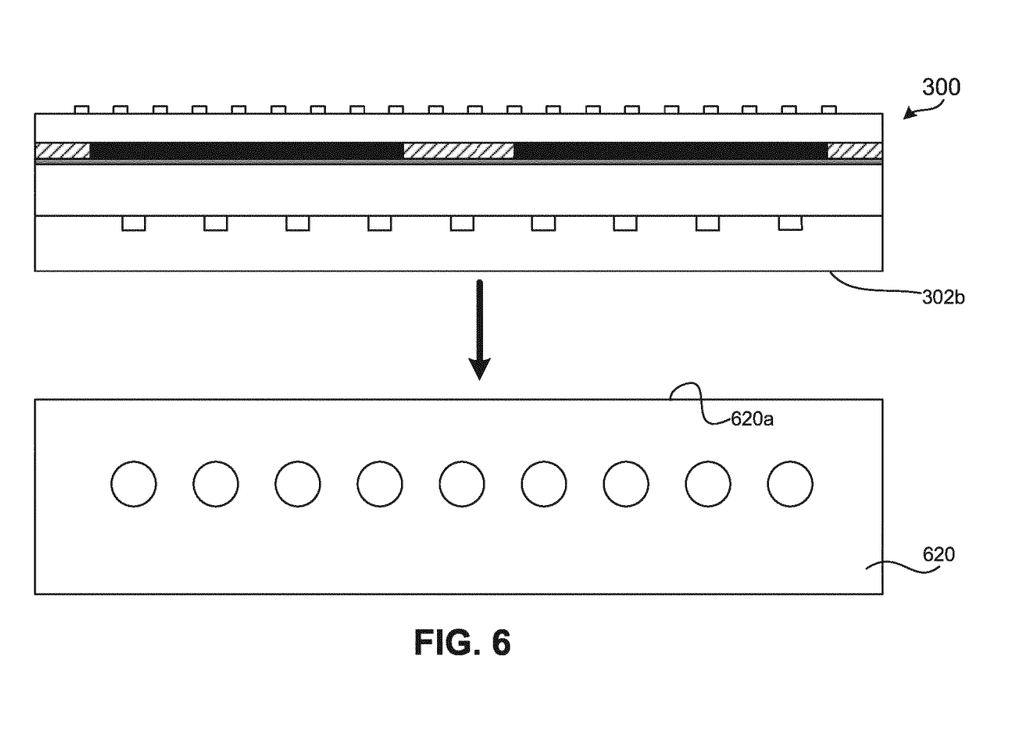
FIG. 6 is a schematic illustration of a cross-sectional view of an electrostatic clamp during coupling with a chuck, according to embodiment of the invention.

FIG. 6 illustrates a cross-sectional view of electrostatic clamp 300 during coupling of electrostatic clamp 300 to a chuck 620. Chuck 620 may be similar to chuck 420 in structure and function, as described above with reference to FIG. 4. In an embodiment, the coupling process may include polishing and cleaning of surfaces 302b and 620a followed by direct bonding of these surfaces. Surfaces 302b and 620a may be polished to a root mean square (RMS) roughness of about 0.5 mm or lower using any suitable polishing process, such as, but not limited to, cerium oxide slurry polishing process. Subsequently, surfaces 302b and 620a may be pressed together to form a direct bond between surfaces

302b and 620a. As would be appreciated by those skilled in the relevant art(s), other types of bonding or coupling may be used for coupling of electrostatic clamp 300 to chuck 620.

Example Steps for Manufacturing an Electrostatic Clamp

Figure 7:
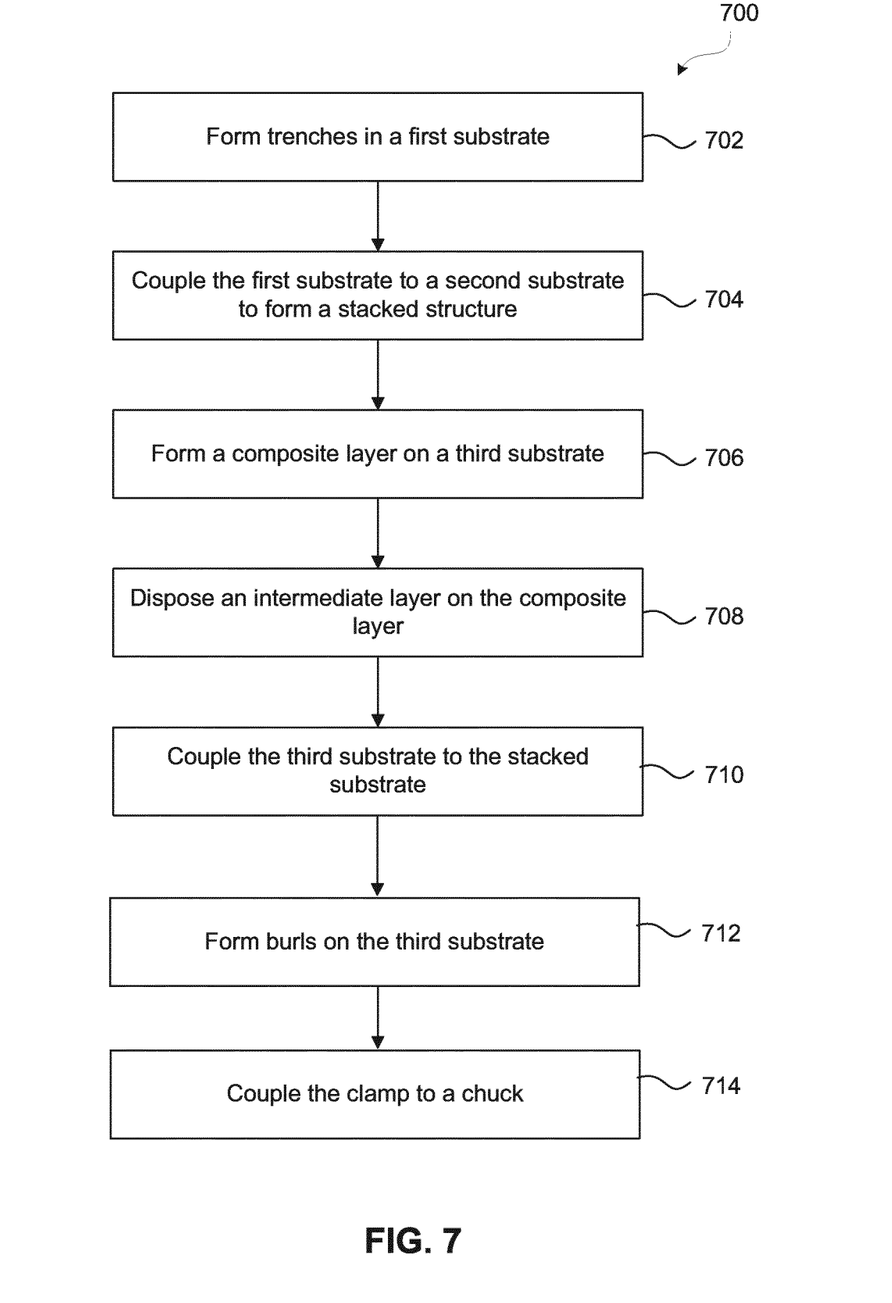
FIG. 7 is a flowchart for a manufacturing process of an electrostatic clamp, according to an embodiment of the invention.

FIG. 7 illustrates a flowchart for manufacturing electrostatic clamp 300 and coupling electrostatic clamp 300 to a chuck, according to an embodiment. Solely for illustrative purposes, the steps illustrated in FIG. 7 will be described with reference to example fabrication process illustrated in FIGS. 5A-5N and 6. Steps can be performed in a different order or not performed depending on specific applications.

In step 702, trenches are formed on a first layer. For example, trenches such as trenches 530 may be formed a first layer such as first layer 302, as illustrated in FIG. 5A. Trenches 530 may be formed using standard glass machining techniques.

In step 704, the first layer is coupled to a second layer to form a stacked structure. For example, a second layer such as second layer 304 may be coupled to first layer 302 to form a stacked structure similar to stacked structure 532, as illustrated in FIG. 5B. The coupling process may include direct bonding of surfaces 302a and 304b. Direct bonding may be performed by pressing surface 302a against surface 304b under a pressure suitable for the layer materials used. The stacked structure 532 may be annealed at a temperature in the range of about 350-800 degrees Celsius.

In step 706, a composite layer is formed on a third layer. For example, a composite layer similar to composite layer 308 may be formed on third layer 306, as illustrated in FIGS. 5C-F. Composite layer 308 may be formed by deposition, patterning, and etching of a metal layer such as metal layer 510 on third layer 306 followed by deposition, patterning, and etching of a dielectric layer such as dielectric layer 512. The deposition of metal layer 510 may be performed using, for example, sputtering, thermal evaporation, atomic layer deposition (ALD), or chemical vapor deposition (CVD). The deposition of dielectric layer 512 may be performed using, for example, CVD process, magnetron sputtering, thermal evaporation, or e-beam evaporation.

In step 708, an intermediate layer is formed on the composite layer. For example, an intermediate layer similar to intermediate layer 314 may be formed on composite layer 308, as illustrated in FIG. 5G. Intermediate layer 314 may be deposited using, for example, CVD process.

In step 710, the third layer is coupled to the stacked structure to form an electrostatic clamp. For example, third structure 306 may be coupled to stacked structure 532 by direct bonding intermediate layer 314 to surface 304a of stacked structure, as illustrated in FIG. 5H.

In optional step 712, burls are formed on clamping surface of the clamp. For example, burls such as burls 305 may be formed on clamping surface such as clamping surface 306a of third layer 306, as illustrated in FIGS. 5I-J. Burls 305 may be formed by deposition, patterning, and etching of a polymeric layer 505.

In optional step 714, the electrostatic clamp is coupled to a chuck. For example, electrostatic clamp 300 may be coupled to a chuck similar to chuck 620, as illustrated in FIG. 6. The coupling may be performed by direct bonding surface 302b of clamp 300 to surface 620a of chuck 620.

Although specific reference may be made in this text to the use an electrostatic clamp in lithographic apparatus, it should be understood that the electrostatic clamp described herein may have other applications, such as for use in mask inspection apparatus, wafer inspection apparatus, aerial image metrology apparatus and more generally in any apparatus that measures or processes an object such as a wafer (or other substrate) or mask (or other patterning device) either in vacuum or in ambient (non-vacuum) conditions, such as, for example in plasma etching apparatus or deposition apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The terms "radiation" and "beam" as used herein encompass all types of electromagnetic radiation, including ultraviolet (UV) radiation (e.g., having a wavelength of or about 365, 355, 248, 193, 157 or 126 nm) and extreme ultraviolet (EUV) radiation (e.g., having a wavelength in the range of 5-20 nm), as well as beams of charged particles, such as ion beams or electron beams.

The term "lens", where the context allows, may refer to any one or combination of various types of optical components, including refractive, reflective, magnetic, electromagnetic and electrostatic optical components.

The term "etch" or "etching" or "etch-back" as used herein generally describes a fabrication process of patterning a material, such that at least a portion of the material remains after the etch is completed. For example, generally the process of etching a material involves the steps of patterning a masking layer (e.g., photoresist or a hard mask) over the material, subsequently removing areas of the material that are no longer protected by the mask layer, and optionally removing remaining portions of the mask layer. Generally, the removing step is conducted using an "etchant" that has a "selectivity" that is higher to the material than to the mask layer. As such, the areas of material protected by the mask would remain after the etch process is complete. However, the above is provided for purposes of illustration, and is not limiting. In another example, etching may also refer to a process that does not use a mask, but still leaves behind at least a portion of the material after the etch process is complete.

The above description serves to distinguish the term "etching" from "removing." In an embodiment, when etching a material, at least a portion of the material remains behind after the process is completed. In contrast, when removing a material, substantially all of the material is removed in the process. However, in other embodiments, 'removing' may incorporate etching.

The terms "deposit" or "dispose" as used herein describe the act of applying a layer of material to a substrate. Such terms are meant to describe any possible layer-forming technique including, but not limited to, thermal growth, sputtering, evaporation, chemical vapor deposition, epitaxial growth, atomic layer deposition, electroplating, etc.

The term "substrate" as used herein describes a material onto which subsequent material layers are added. In embodiments, the substrate itself may be patterned and materials added on top of it may also be patterned, or may remain without patterning.

The term "substantially" or "in substantial contact" as used herein generally describes elements or structures in physical substantial contact with each other with only a slight separation from each other which typically results from fabrication and/or misalignment tolerances. It should be understood that relative spatial descriptions between one or more particular features, structures, or characteristics (e.g., "vertically aligned," "substantial contact," etc.) used herein are for purposes of illustration only, and that practical implementations of the structures described herein may include fabrication and/or misalignment tolerances without departing from the spirit and scope of the present disclosure.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. A device manufacturing method, the method comprising:
    forming a plurality of fluid channels between a first layer and a second layer, the plurality of fluid channels being configured to carry a thermally conditioned fluid;
    disposing a composite layer on a third layer, the composite layer comprising alternating conductive layers and insulating layers, wherein the first, second, and third layers comprise a same ultra-low expansion material having a substantially zero coefficient of thermal expansion; and
    bonding the third layer to the second layer, wherein the bonding is performed at a temperature above about 350° C.

2. The method of claim 1, wherein forming the plurality of fluid channels comprises:
    forming a plurality of trenches on a top surface of the first layer;
    polishing a bottom surface of the second layer;
    direct bonding the top surface of the first layer to the bottom surface of the second layer to form a bonded structure of the first layer and the second layer; and
    annealing the bonded structure.

3. The method of claim 1, wherein disposing the composite layer comprises:
    disposing a metal layer on a bottom surface of the third layer;
    patterning the metal layer;
    disposing a dielectric layer on the bottom surface of the third layer and the patterned metal layer; and
    patterning the dielectric layer.

4. The method of claim 1, wherein coupling the third layer to the second layer comprises:
    disposing an intermediate layer on the composite layer; and
    direct bonding the intermediate layer to a top surface of the second layer.

5. The method of claim 1, further comprising forming a plurality of burls on a top surface of the third layer, the plurality of burls being configured to receive an object for clamping.

6. The method of claim 5, wherein forming the plurality of burls comprises:
    disposing a polymeric layer on the top surface of the third layer; and
    patterning the polymeric layer.

7. The method of claim 1, wherein the first, second and third ultra-low expansion materials comprise an ultra-low expansion glass.

* * * * *

UNITED STATES PATENT AND TRADEMARK OFFICE
CERTIFICATE OF CORRECTION

| | |
|---|---|
| PATENT NO. | : 10,310,391 B2 |
| APPLICATION NO. | : 15/504749 |
| DATED | : June 4, 2019 |
| INVENTOR(S) | : Lipson et al. |

It is certified that error appears in the above-identified patent and that said Letters Patent is hereby corrected as shown below:

On the Title Page

In item (54), Title, and in the Specification, in Column 1, Line 1, please replace "Electrostatic Clamp and a Method for Manufacturing the Same" with --An Electrostatic Clamp and a Method for Manufacturing the Same--.

Signed and Sealed this
Tenth Day of September, 2019

Andrei Iancu
*Director of the United States Patent and Trademark Office*